United States Patent [19]

Okazaki et al.

[11] Patent Number: 4,972,140

[45] Date of Patent: Nov. 20, 1990

[54] CURRENT DETECTION DEVICE AND CORE FOR DETECTION OF MAGNETIC FLUX

[75] Inventors: Kunio Okazaki, Hatano; Toru Tanabe, Yokohama; Masashi Suzuki, Yokohama; Hideki Kitamura, Yokohama; Seiichi Sudo, Yokohama; Takao Seto, Yokohama, all of Japan

[73] Assignee: Stanley Electric Co., Ltd., Tokyo, Japan

[21] Appl. No.: 206,598

[22] Filed: Jun. 14, 1988

[51] Int. Cl.⁵ .............................................. G01R 1/04
[52] U.S. Cl. ............................ 324/117 H; 324/117 R; 324/127; 338/32 H
[58] Field of Search .......... 307/309; 338/32 H, 32 R; 324/117 H, 117 R, 127, 251, 252; 336/178

[56] References Cited

U.S. PATENT DOCUMENTS

| | | | |
|---|---|---|---|
| 3,199,026 | 8/1965 | Leibowitz | 324/117 H |
| 4,099,238 | 7/1978 | Suzuki | 324/251 |
| 4,190,799 | 2/1980 | Miller et al. | 324/228 |
| 4,362,990 | 12/1982 | Schneider et al. | 324/117 R |
| 4,449,081 | 5/1984 | Doemen | 324/117 H |
| 4,656,418 | 4/1987 | Boston et al. | 324/127 |
| 4,791,361 | 12/1988 | Beihoff et al. | 324/117 H |

FOREIGN PATENT DOCUMENTS

| | | | |
|---|---|---|---|
| 2918329 | 12/1980 | Fed. Rep. of Germany | 324/117 H |
| 2106710 | 4/1983 | United Kingdom | 338/32 H |

OTHER PUBLICATIONS

"Hall Effect Current-Sense Module", by Arnold et al., IBM Tech. Disc. Bull., vol. 17, #11, pp. 3218-3219, 4/75.

Primary Examiner—Reinhard J. Eisenzopf
Assistant Examiner—William J. Burns
Attorney, Agent, or Firm—Louis Weinstein

[57] ABSTRACT

The present invention provides a current detection device comprising a core skirt for accommodating therein a core, a core stopper for fixing the core and a magnetic-sensitive element mounted on a substrate, the substrate and the core skirt having engaging portions for locating the magnetic-sensitive element, respectively, provided thereon, and further provides a core for detection of a magnetic flux.

14 Claims, 5 Drawing Sheets

10

CURRENT DETECTION DEVICE AND CORE FOR DETECTION OF MAGNETIC FLUX

BACKGROUND OF THE INVENTION

(1) Field of the Invention

The present invention relates to a current detection device for detecting a current of batteries, generators and the like mounted on an automobile, and more specifically to a current detection device in which a magentic-sensitive element (such as a Hall element) is disposed in an air gap of a magnetic core to detect a current, and a core for detection of a magnetic flux.

(2) Description of the Prior Art

A device has been heretofore known in which for example, a gap is provided in a ferrite core, a magnetic sensitive element such as a Hall element is disposed therein, and a value of current to be detected is detected from an output of said magnetic-sensitive element. More specifically, when a current to be detected flows into a coil (or an electric wire inserted into a hollow portion) wound around the ferrite core, a magnetic field is generated according to a value of said current, and the magnetic field is detected by the magnetic-sensitive element whereby the current value thereof can be detected. In this case, the output of the magnetic-sensitive element is small, and accordingly, amplification processing and other signal processings are required. To this end, a construction has been often practically used wherein circuit elements for these signal processings and the aforesaid magnetic-sensitive element are packaged on a printed substrate, the entire body of which is accommodated within a case.

However, in the current detector constructed as described above, it is difficult to positively locate the magnetic-sensitive element into the gap of the core, and there is a problem in that the assembling workability is bad. Further problems are that the magnetic-sensitive element is worn and the core is removed from the case. Furthermore, when the core is greatly deformed or the dimension of the air gap is large, it becomes difficult to assure the locating accuracy of the magnetic-sensitive element, which also entails a difficulty in maintaining the accuracy of measurement.

OBJECT OF THE INVENTION

An object of the present invention is to provide a current detection device which can easily and accurately place a magnetic-sensitive element in a gap of a core and can positively hold it in position. A further object of the present invention is to provide a current detection device which enables gain adjustment and zero adjustment for obtaining good output characteristics and which can select the outside resistor to thereby provide a suitable output voltage span. Another object of the present invention is to provide a core for detection of a magnetic flux which can contribute to miniaturization and enlargement of measuring range and can assure measurement with high accuracy.

SUMMARY OF THE INVENTION

According to the present invention, there is provided an arrangement wherein a magnetic-sensitive element is disposed in a gap provided in a core and a current value is detected from an output of said magnetic-sensitive element according to a current to be detected, comprising a core skirt for accommodating therein said core and a core stopper for fixing the core, said magnetic-sensitive element being mounted on a substrate, said substrate and said core skirt having engaging portions for locating the magnetic-sensitive element, respectively, provided thereon.

According to the present invention, there is further provided an arrangement which comprises a detection portion in which a Hall element is inserted into a gap portion of a ring-like magnetic core with a gap and an electric wire allowing a current to be detected to flow is inserted into a hollow portion of the core, means for setting a current flowing into said Hall element, an amplification portion for amplifying a Hall voltage of said Hall element, means for applying a bias voltage for zero adjustment to said amplification portion, and a constant current output circuit having an MOS-FET in an output stage.

Furthermore, according to a core for detection of a magnetic flux of the present invention, a core portion is formed of an amorphous material, and a spacer is molded so that it can engage an end of the core portion and has a recess for mounting a magnetic-sensitive element, said spacer being inserted into an air gap.

DETAILED DESCRIPTION OF THE INVENTION

Figure 1:
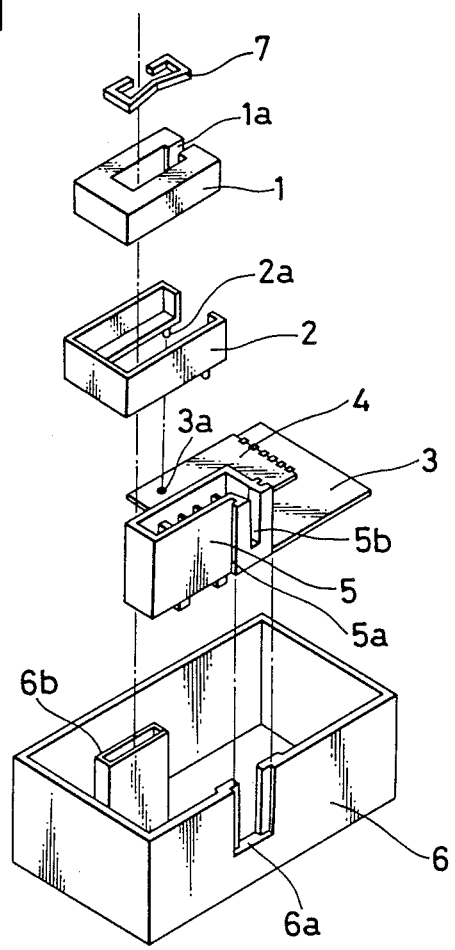
FIG. 1 is an exploded perspective view showing one embodiment of a current detection device according to the present invention.

FIG. 1 is an exploded perspective view showing one embodiment of the present invention. In FIG. 1, reference numeral 1 designates a ferrite core provided with a gap 1a, the ferrite core being accommodated within a core skirt 2, and a Hall element, which will be described later, as a magnetic-sensitive element, is disposed in the gap 1a. Reference numeral 3 designates a printed wiring substrate on which are mounted a HIC (Hybrid Integrated Circuit) 4, an accommodating housing member 5 for coupler parts and the like, the HIC 4 having the aforesaid Hall element packaged therein. The printed wiring substrate 3 and the core skirt 2 are respectively provided with a hole 3a and a projection 2a, which serve as engaging portions for locating the Hall element, the projection 2a being fitted into the hole 3a. Reference numeral 6 designates a box-type case for accommodating the entire body of these parts. The case 6 is provided in the side thereof with a slot 6a, into which can be inserted a side end portion 5a of the accommodating housing member 5 for the coupler parts, which is formed as a slit construction. The case 6 is also formed with a projecting portion 6b which extends through a central portion of the ferrite core 1, and a core stopper 7 is fitted about the extreme end of the projecting portion 6b by spring action to prevent the ferrite core 1 from being easily slipped off. A drain hole 5b is formed in the side end 5a of the accommodating member 5 for coupler parts to prevent water from being collected.

Figure 2:
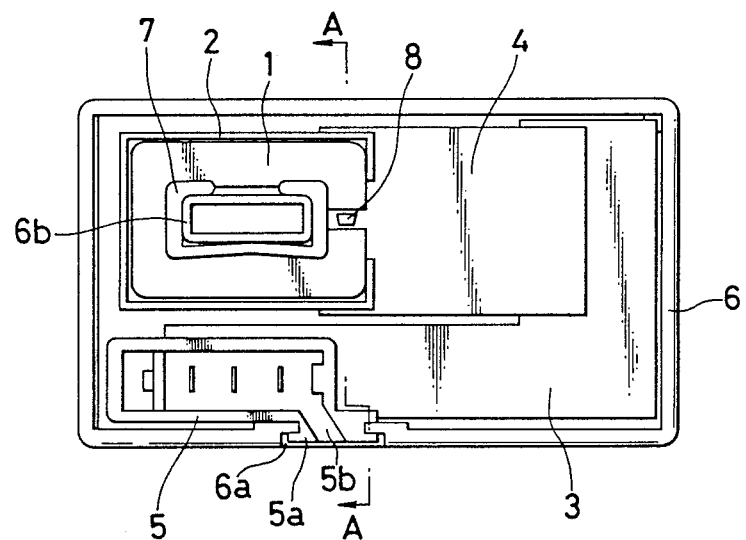
FIG. 2 is a top view of the device in said embodiment of FIG. 1.
Figure 3:
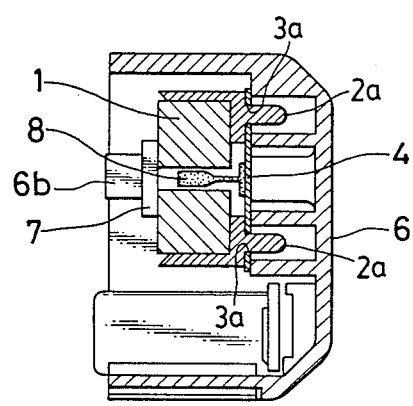
FIG. 3 is a sectional view taken on line A—A of FIG. 2.

FIG. 2 is a top view showing the state of the apparatus after the aforementioned current detection device has been assembled. A Hall element 8 is disposed within the gap 1a of the ferrite core 1 as previously mentioned. FIG. 3 is a sectional view taken on line A—A of FIG. 2.

In the current detection device constructed as described above, first, the coupler parts and HIC 4 are mounted on the printed wiring substrate 3 by soldering, which is accommodated within the case 6. At this time, the printed wiring substrate 3 is accommodated so that the side end 5a of the acccommodating member 5 for coupler parts comes into engagement with the grooves along the marginal edges of the slot 6a of the case 6. Subsequently, the ferrite core 1 set into the core skirt 2 is accommodated from the top. In this case, the Hall element 8 must be properly accommodated within the gap 1a provided in the ferrite core 1. To determine the positions of the Hall element 8 and the gap 1a, the 3a, 3a are provided in the printed substrate 3, and the core skirt 2 is provided with projections 2a, 2a through which extends into the hole 3a. Then, if a design is made so that when the core skirt Z having the ferrite core 1 accommodated therein is put in from the top of the printed substrate 3 within the case 6, the projection 2a of the core skirt 2 enters the hole 3a of the printed substrate 3, the Hall element 8 in the HIC 4 on the printed substrate 3 positively enters the gap 1a of the ferrite core 1. At this time, the Hall element 8 is accurately positioned in both the lateral and longitudinal directions.

After the ferrite core 1 has been accommodated, a core stopper 7 is then mounted from the top thereof. In this case, the core stopper 7 is applied to the periphery of the projecting portion 6b formed on the case 6 to prevent the core stopper 7 from being easily disengaged by the spring action thereof. Thereby, all of the aforementioned various parts are fixed within the case 6, and the ferrite core 1 is not easily removed and locating of the Hall element 8 in a vertical direction is carried out.

To compensate for an error in mounting position of the HIC 4 mounted on the printed substrate 3 and the Hall element packaged on the HIC 4, the hole 3a of the printed substrate 3, the ferrite core 1 and a clearance where the coreskirt Z enters a portion allowing a current to pass have their sizes selected in anticipation of the error. Further, the accommodating member 5 for coupler parts is provided with the drain hole 5b, and therefore, entry of water is prevented, and terminals are not corroded due to leakage of electricity.

Since the printed substrate 3 and the core skirt Z are respectively provided with engaging portions, the Hall element 8 can be easily and positively disposed in the gap 1a of the ferrite core 1. Assembling workability is good. Furthermore, the Hall element 8 is not deviated from the gap 1a of the core 1, and the core 1 is not disengaged.

In the case where the interior of the case 6 is molded with resins, the resins are not leaked from connector portions of the coupler parts since the accommodating member 5 for coupler parts and the case 6 are of the slit construction. Moreover, during transportation of the device prior to molding or the like, no stress is applied to the Hall element 8 or the like since the parts within the case 6 are locked by the core stopper 7.

Figure 4:
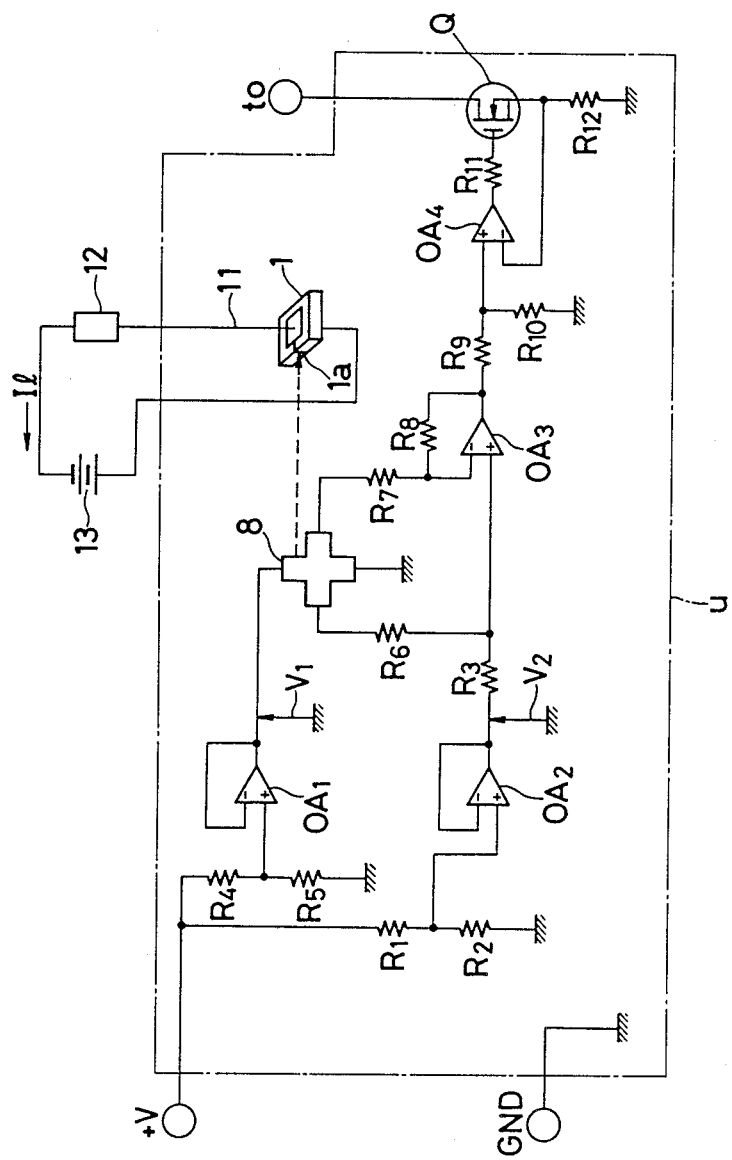
FIG. 4 is a circuit diagram view showing the circuit structure.

FIG. 4 shows a circuit construction, comprising a ring-like ferrite core 1 with a gap 1a, a Hall element 8 (shown outside the gap 1a for convenience' sake of explanation) inserted into the gap 1a of the ferrite core 1, resistors $R_1$ to $R_{12}$, operational amplifiers $OA_1$ to $OA_4$, and an MOSFET Q. The Hall element 8 used is of the IC form.

The operational amplifier $OA_1$ has, as an input, a voltage obtained by dividing a voltage $(+)$ V by resistors $R_4$ and $R_5$, obtains a voltage $V_1$ having the same value as the input at an output end thereof, and said voltage $V_1$ is applied to a current terminal of the Hall element 8. The operational amplifier $OA_2$ has, as an input, a voltage obtained by dividing a voltage $(+)$ V by resistors $R_1$ and $R_2$, obtains a voltage $V_2$ at an output end thereof, and said voltage $V_2$ is applied to a $(+)$ input terminal of said operational amplifier $OA_2$. A $(+)$ input terminal of the operational amplifier $OA_3$ is connected to one voltage terminal of said Hall element 8 through a resistor $R_6$, and a $(-)$ input terminal thereof is connected to the other voltage terminal of the Hall element 8 and is connected to its own output terminal through a resistor $R_8$. The output of the operational amplifier $OA_3$ is applied to an operational amplifier $OA_4$ constituting a constant current circuit, and the MOS-FET Q on the output stage is controlled by the output thereof. A detection output (current output) is obtaIned at the FET Q.

On the other hand, an electric wire 11 is inserted into the ferrite core 1, and the wire 11 is connected to a dc power source 13 through a load 12. That is, a load current Il is allowed to flow into the electric wire 11, said current being detected.

Figure 5:
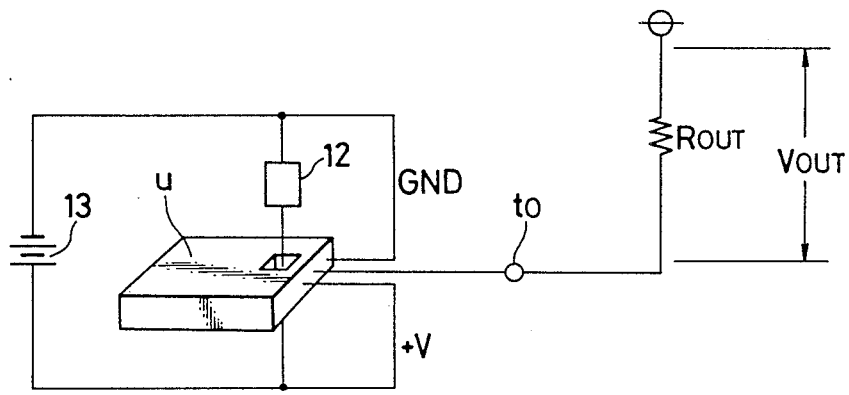
FIG. 5 is a connection diagram in the case where the device having said circuit structure is formed into a unit.

Output voltages $V_1$ and $V_2$ of the operational amplifiers $OA_1$ and $OA_2$ are regulated by the change of division-ratio of a voltage divider on the input side (a semi-fixed resistor is used; or in case of HIC or the like, a resistance trimming means is used) so as to perform gain adjustment and zero adjustment (bias adjustment). A portion u surrounded by the phantom outline is formed into a unit as shown in FIG. 5 by formation thereof into an IC or the like. This unit u is formed with wire receiving holes and is provided with a control power supply terminal $(+)$ V, GND and a detection output terminal to. Resistor $R_{out}$ is connected to the output terminal to so as to obtain a voltage $V_{out}$ across the terminals of $R_{out}$.

With the construction as just mentioned, when the load current Il is allowed to flow into the electric wire 11, a magnetic field proportional to the current Il is generated in the gap 1a of the ferrite core 1, which magnetic field is applied to the Hall element 8. By the application of voltage $V_1$, a current flows into the Hall element 8 to generate a magnetic field, i.e., a Hall voltage proportional to the load current Il between voltage terminals of the Hall element 8. This voltage is amplified by the operational amplifiers $OA_3$ and $OA_4$ and formed into a current output at the MOS-FET Q. This current (mA order) is proportional to a current (A order) to be detected. In this case, the gain adjustment and zero adjustment are carried out by the regulation of the output voltages $V_1$ and $V_2$ of the operational amplifiers $OA_1$ and $OA_2$, and therefore, a good output characteristic is obtained.

A current flowing into the resistor $R_{out}$ connected to the detection output terminal to is detected by resistor $R_{12}$ of a low resistance and is controlled by a constant current circuit comprising the operational amplifier $OA_4$. For this output stage, MOS-FET Q is used, and currents flowing into resistor $R_{12}$ are all considered to be currents flowing into resistor $R_{out}$, providing a detection with high accuracy.

While in the foregoing description, the resistor $R_{out}$ has been described to be an external mounting, it is noted that this can be provided within the unit u to use as a voltage output. Further, the resistance of the resistor $R_{out}$ can be varied to vary the value of the voltage $V_{out}$.

Figure 6:
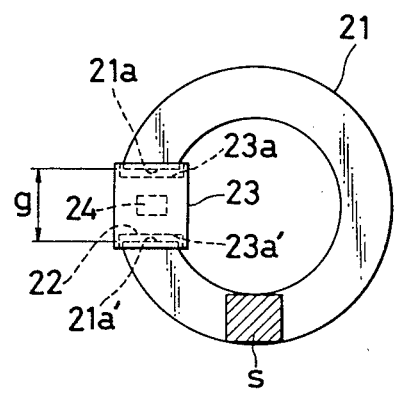
FIG. 6 is a plan view showing an example of construction of a core for detection of a magnetic flux according to the present invention.
Figure 7:
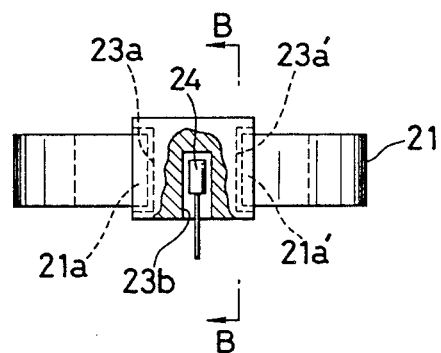
FIG. 7 is a front view of the same.
Figure 8:
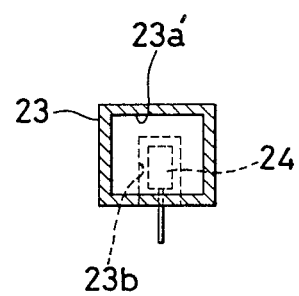
FIG. 8 is a sectional view taken on line B—B of FIG. 7.

FIGS. 6 to 8 show another example of the construction of a core for detection of a magnetic flux. In these drawings, reference numeral 21 designates a core portion which has a rectangular (sectional view s) and in which an amorphous material molded into an annulus is wound in its periphery by a ribbon-like metal foil, 22 an air gap portion having a width g defined between opposite ends 21a and 21a' of the core portion 21, and 23 a spacer which has at its opposite ends engaging portions 23a and 23a' formed so as to match and accommodate (i.e., receive) ends 21a and 21a' of the core portion 21, the dimension between both said ends being set to be larger than the width g of the air gap 22, and in which is formed with a recess 23b for accommodating and holding a magnetic-sensitive element 24 such as a Hall element to be positioned at right angles to the direction of a magnetic flux generated in the air gap 22.

Since the core for detection of a magnetic flux is constructed as described above, mounting of the spacer 23 into the air gap 22 is accomplished by fitting the ends 21a and 21a' of the core portion 21 respectively into the engaging portions 23a and 23a' of the spacer 23, and if the core portion 21 and the spacer 23 become once engaged each other, the spacer 23 is not disengaged from the core portion 21. In this mounting, if the core portion 21 is made to be moderately flexed to widen the width g of the air gap portion 22, mounting of the spacer 23 can be easily carried out. By such mounting of the spacer 23, accurate locating of the magnetic-sensitive element 24 arranged within the recess 23b of the spacer 23 with respect to the ends 21a and 21a' of the core portion 21 may be carried out. The core portion 21 with the spacer 23 mounted thereon sometimes undergoes an external force during the assembling work thereof or in the package thereof on the current detector or the like, but the spacer 23 is prevented from being deformed by the external force of the easily deformable core portion 21, whereby the width g of the air gap portion 22 can be always maintained constant. Further, the greater the set value of the width g of the air gap 22, the more difficult it becomes to locate the magnetic-sensitive element 24 mounted within the recess 23b of the spacer 23. However, even in this case, high accuracy locating can be effected by the provision of the spacer 23, as a consequence of which when actual use is made as a current detector or the like, enhancement of measuring precision and maintenance thereof can be assured.

Incidentally, the core portion 21 is formed of an amorphous material, and a saturated magnetic flux density in the detection of magnetic flux can be set to a large value. But according to the experimental result of a current detector using a core portion 21 having the outside diameter of approximately 35 mm, for example, a detection of a current of 1500 Amperes can be made. With a small device, a maximum detectable current value is remarkably increased. Also in this case, it is assured that high measuring accuracy is secured, and thus miniaturization of the device and enlargement of the measuring range are realized and the enhancement of function of a device of this kind is achieved.

In the production of a core according to the present invention, in the case where the resin mold is applied to the whole core portion 21 and spacer 23, the recess 23b of the spacer 22 is made to be opened directed perpendicularly downwardly (see FIG. 7) so that the resin for the mold is poured from the upper side of the spacer 23 thereby preventing entry of resin into the recess 23b, and when said resin is solidified, propagation of the external force toward the magnetic-sensitive element 24 can be avoided therethrough, whereby an occurrence of a bad influence of the external force exerted on the magnetic-sensitive element 24, which is liable to undergo an external force or the like to bring forth a variation in output, can be positively arrested.

In the case where the core portion 21 is formed of a ferrite material, mounting of the spacer 23 is facilitated by cutting a part of the ends 21a and 21a', in which case, the width g of the air gap 22 is maintained constant irrespective of the spacer 23, whereas the magnetic-sensitive element 24 itself is accurately positioned by the spacer 23 in a manner similar to the above. In the case of using such a ferrite material, the dimension between the ends of the spacer 23 is required to be set somewhat smaller than the width g of the air gap 22.

As described above, according to the present invention, the locating engaging portions and the core stopper for locking the core are provided on the substrate on which are mounted the core skirt for accommodating the core and the magnetic-sensitive element. Therefore, the magnetic-sensitive element can be easily and positively fitted in the gap of the core with high accuracy. The assembling workability is good. Furthermore, there is an advantage that deviation of the magnetic-sensitive element and disengagement of the core can be prevented.

Moreover, the Hall voltage of the Hall element can be amplified and the FET of the output stage can be controlled to obtain the detection output. Therefore, a current or voltage proportional to a current to be detected can be detected. The outside mounted resistor can be selected to provide a suitable output voltage range. Furthermore, the output characteristic may be improved by the gain adjustment and zero adjustment, and the MOS-FET of a low ON resistance is used in the output stage. Therefore, a voltage drop of FET Q can be ignored, and even if a resistor connected to the output end is connected to a 5-V system it is possible to increase the effective voltage range.

A spacer capable of engaging the end of the core portion and molded so as to have a recess for mounting a magnetic-sensitive element is mounted in the air gap. Therefore, the locating accuracy of the magnetic-sensitive element be enhanced, and the deformation of the code caused by the external force can be prevented. It is possible to provide a core for detection of a magnetic flux which can contribute to miniaturization and enlargement of a measurement range, and which can assure measurement with high precision.

What is claimed is:

1. A current detection device wherein a magnetic-sensitive element is disposed in a gap provided in a ferrite core having a central opening an an air gap and a current value is detected from an output of said magnetic-sensitive element according to a current to be detected, the device comprising a core skirt for accommodating therein and surrounding said core which is releasably supported in and engages said skirt and a core stopper means to maintain the position of said core relative to said skirt for releasably fixing the core to said skirt, said magnetic-sensitive element being mounted on a substrate, said substrate and said core skirt having cooperating engaging portions for accurately locating the magnetic-sensitive element provided thereon; the engaging portions of one of said substrate and said core skirt being projections and the engaging portions of the remaining one of said substrate and said core skirt being openings each for receiving one of said projections; and said core skirt having a slot aligned with said air gap, said magnetic-sensitive element extending through said slot and into said air gap.

2. A current detection device comprising a detection portion in which a Hall element is inserted into a gap portion of a ring-like magnetic core with a gap and an electric wire allowing a current to be detected to flow is inserted into a hollow portion of the core, means for providing a current to said Hall element, amplifier means for amplifying a Hall voltage of said Hall element, means for applying a bias voltage for zero adjustment to said amplifier means, and a constant current output circuit having an MOS-FET for generating an output current.

3. Apparatus for detection of current through a conductor comprising:
   a one-piece core provided with a central opening and an air gap;
   a substrate having a magnetic field sensing element mounted thereon;
   circuit means for developing an output from said magnetic field sensing element being mounted on said substrate;
   skirt means for receiving said core and releasably positioning said core upon said substrate so that said magnetic field sensing element is properly located within said air gap;
   a housing for receiving said substrate, said housing including a hollow integral projection extending through an opening in said substrate, an opening in said core positioning means and the central opening in said core, said hollow projection receiving said conductor;
   means releasably joined to said projection and engaging a surface of said core for retaining said core, said positioning means, said substrate and hence said magnetic field sensing element assembled and in proper alignment.

4. The apparatus of claim 3 wherein said positioning means comprises a core skirt having a wall embracing said core and having an elongated slot through which said integral projection and said magnetic field sensing element extend at spaced locations therealong.

5. The apparatus of claim 4 wherein said core skirt and said substrate have interengaging elements for accurately positioning said core skirt relative to said substrate.

6. The apparatus of claim 5 wherein said interengaging elements respectively comprise at least one projection and an opening for receiving said projection.

7. The apparatus of claim 6 wherein said opening is provided in said substrate and said core skirt is provided with said projection.

8. The apparatus of claim 3 wherein said housing for receiving said substrate is comprised of a floor portion surrounded by integral sidewalls;
   one of said sidewalls having a slot;
   said substrate having a printed wiring arrangement;
   a coupling element for coupling said printed wiring arrangement on said substrate to external circuitry;
   a coupling housing for receiving said coupling element, said coupling housing having a projection slidably received within said slot for interlocking said first mentioned housing and said coupling housing.

9. Current detection apparatus comprising a magnetic core having a central opening and an air gap communicating with said central opening;
   a magnetic field sensing element being positioned within said air gap;
   first circuit means for controlling said magnetic field sensing means to regulate its output;
   second circuit means coupled to said magnetic field sensing means for generating an output signal representative of the field in said air gap;
   said first and second circuit means and said magnetic field sensing means and said core being formed as an integrated circuit comprising a unitary member having an opening aligned with the central opening of said core for receiving a current carrying winding and having electrical terminals arranged along the surface of said unit for coupling to external circuitry, said integrated circuit unit maintaining said magnetic field sensing means in proper position within said air gap.

10. The apparatus of claim 9 wherein said first circuit means includes means for adjusting the zero output of said magnetic field sensing element.

11. The apparatus of claim 9 wherein said second circuit means includes an output stage having an MOS FET for producing an output current representative of the magnetic field in said air gap.

12. Apparatus for current detection comprising:
   a core provided with an air gap;
   a first hollow housing open at one end thereof and having a floor at the opposite end thereof for supporting said core;
   the sidewalls of said housing extending between said floor and said open end surrounding and having a shape adapted to retain said core in a fixed position in said first housing;
   a substrate having a magnetic field sensing element mounted thereon;
   circuit means for developing an output from said magnetic field sensing element being mounted on said substrate;
   said substrate including interengaging means;
   a second hollow housing for receiving said substrate and said first housing;
   said second housing having cooperating interengaging means for coupling with the interengaging means of said circuit means for retaining said circuit means in a predetermined position within said second housing;
   said core having a central opening;
   the base of said first housing having an opening substantially in alignment with the opening in said core;

said second housing having a projection extending through the opening in the base of said first housing and through the opening in said core;

said projection being of a length sufficient to extend beyond said core; and releasable locking means for engaging the portion of said projection extending beyond said core for locking said core, said first housing and said substrate to said second housing.

13. The apparatus of claim 12 wherein said first housing is provided with a plurality of projections extending toward said substrate;

said substrate being provided with a plurality of openings, each of said openings being aligned with an associated projection on said first housing;

said projections extending into the openings in said substrate when said first housing is mounted thereon to thereby precisely locate said sensing element in the air gap of said core.

14. The apparatus of claim 12 wherein the interengaging means of said substrate comprises a pair of undercut grooves and the interengaging means of said second housing comprises a pair of edges slidably received in said undercut grooves.

* * * * *

UNITED STATES PATENT AND TRADEMARK OFFICE
CERTIFICATE OF CORRECTION

PATENT NO. : 4,972,140

DATED : November 20, 1990.

INVENTOR(S) : Okazaki et al.

It is certified that error appears in the above-identified patent and that said Letters Patent is hereby corrected as shown below:

```
Column 1, lines 10-11, "magentic" should be --magnetic--
Column 3, line 26, "the 3a, 3a" should be --holes 3a, 3a--
Column 3, line 28, delete "through"
Column 3, line 30, "skirt Z" should be --skirt 2--
Column 3, line 50, after "element" insert --8--
Column 3, line 52, "coreskirt Z" should be --core skirt 2--
Column 3, line 58, "skirt Z" should be --skirt 2--
Column 5, line 18, after "rectangular" insert --cross-section--
Column 5, line 18, before "sectional" insert --see--
Column 7, line 1, change "an an air" to --and an air--
```

Signed and Sealed this

Thirty-first Day of March, 1992

Attest:

HARRY F. MANBECK, JR.

*Attesting Officer*   *Commissioner of Patents and Trademarks*